(12) United States Patent
Higashino (10) Patent No.: US 8,339,120 B2
(45) Date of Patent: Dec. 25, 2012

(54) MEASUREMENT APPARATUS, REPRODUCTION APPARATUS, AND MEASUREMENT METHOD

(75) Inventor: Satoru Higashino, Tokyo (JP)

(73) Assignee: Sony Corporation, Tokyo (JP)

( * ) Notice: Subject to any disclaimer, the term of this patent is extended or adjusted under 35 U.S.C. 154(b) by 499 days.

(21) Appl. No.: 12/712,396

(22) Filed: Feb. 25, 2010

(65) Prior Publication Data

US 2010/0231195 A1    Sep. 16, 2010

(51) Int. Cl.
*H03D 13/00*    (2006.01)
*H03L 7/06*    (2006.01)

(52) U.S. Cl. .............................. 324/76.77; 327/156

(58) Field of Classification Search ............. 324/76.77, 324/76.11, 521, 622, 620, 612, 683, 76.53, 324/709, 76.52, 138, 606, 647, 656, 76.41; 331/11, 12, 14, 25; 327/156
See application file for complete search history.

(56) References Cited

U.S. PATENT DOCUMENTS

| | | | | |
|---|---|---|---|---|
| 6,028,888 | A * | 2/2000 | Roux | 375/148 |
| 6,150,888 | A * | 11/2000 | Nakazawa | 331/11 |
| 7,064,504 | B2 * | 6/2006 | Imai et al. | 318/400.04 |
| 7,825,701 | B2 * | 11/2010 | Kobata et al. | 327/105 |
| 7,825,739 | B2 * | 11/2010 | Higashino | 331/17 |
| 2009/0179707 | A1 * | 7/2009 | Higashino | 331/17 |

OTHER PUBLICATIONS

Higashino, S. et al., "A parallel architecture of interpolated timing recovery for high-speed data transfer rate and wide capture-range", Technical Digest of Optical Data Storage (ODS) 2007.

* cited by examiner

*Primary Examiner* — Hoai-An D Nguyen
(74) *Attorney, Agent, or Firm* — Wolf, Greenfield & Sacks, P.C.

(57) ABSTRACT

A measurement apparatus includes a moving average calculation section and a convergence judgment section. The moving average calculation section calculates a moving average by inputting a phase error between a phase of an input signal and a target phase, that is detected by a phase-locked loop circuit. The convergence judgment section judges that the phase-locked loop circuit is not converged when an absolute value of the moving average is equal to or larger than a first threshold value and judges that the phase-locked loop circuit is converged when the absolute value of the moving average is smaller than the first threshold value.

8 Claims, 7 Drawing Sheets

MEASUREMENT APPARATUS, REPRODUCTION APPARATUS, AND MEASUREMENT METHOD

BACKGROUND OF THE INVENTION

1. Field of the Invention

The present invention relates to a measurement apparatus that carries out a performance measurement of a PLL (Phase-Locked Loop) circuit and a method therefor. The present invention also relates to a reproduction apparatus including a structure of the measurement apparatus, that reproduces data from a recording medium.

2. Description of the Related Art

PLL circuits are generally provided to communication apparatuses such as a modem and apparatuses that execute data decoding processing in a signal reproduction process in addition to storage apparatuses that perform recording and reproduction in accordance with recording media such as an optical disc recording medium, a magnetic disk recording medium, and a tape-like recording medium. For carrying out appropriate data decoding processing, the PLL circuit needs to be in a locked state and a reproduction signal having a synchronized phase needs to be input to a data decoding processing system.

For example, although an error rate can be used as an evaluation criterion in evaluating performance and quality of the storage apparatuses and recording media described above, a more-accurate evaluation result can be obtained if a judgment on whether the PLL circuit is locked is made in advance. If a state where the PLL circuit is locked and converged is judged in advance, an error rate due to causes other than the PLL circuit can be judged appropriately. Based on this point, a technique that enables operation performance of the PLL circuit to be measured and a convergence state of the PLL circuit to be judged is of a great significance.

For example, "A Parallel Architecture of Interpolated Timing Recovery for High-Speed Data Transfer Rate and Wide Capture-Range" by HIGASHINO Satoru, KOBAYASHI Shoei, and YAMAGAMI Tamotsu, Technical Digest of Optical Data Storage (ODS) 2007, TuB5, describes a technique of directly observing a phase error detected by a PLL circuit in measuring performance of the PLL circuit.

SUMMARY OF THE INVENTION

However, the phase error detected by the PLL circuit contains many jitters, noises, and the like. Therefore, in actuality, it may be extremely difficult to accurately measure, for example, performance of the PLL circuit by observing a phase error detection result as it is.

Thus, under the current circumstances, the apparatuses and recording media are evaluated without measuring a state and performance of the PLL circuit. As a result, as described above, there arises a problem that, when an unfavorable evaluation result is obtained, it is difficult to judge whether the problem is due to the PLL circuit not being sufficiently converged in a locked state or the problem is due to other causes.

In view of the circumstances as described above, there is a need for a technique that enables performance of a PLL circuit to be measured accurately.

In this regard, according to an embodiment of the present invention, there is provided a measurement apparatus including: a moving average calculation means for calculating a moving average by inputting a phase error between a phase of an input signal and a target phase, that is detected by a phase-locked loop circuit; and a convergence judgment means for judging that the phase-locked loop circuit is not converged when an absolute value of the moving average is equal to or larger than a first threshold value and judging that the phase-locked loop circuit is converged when the absolute value of the moving average is smaller than the first threshold value.

With this structure, the moving average is obtained for the phase error detected by the phase-locked loop circuit, and the judgment on whether the phase-locked loop circuit is converged in a locked state is made based on a result of comparing the moving average and the threshold value.

The phase error itself may contain a reasonable amount of noises, but if the moving average is to be obtained, unnecessary variation components due to an effect of noises of the phase error can be suppressed, with the result that a smoother temporal transition of the phase error can be obtained.

As a result, a result of the convergence judgment obtained as described above becomes more accurate than in a case where the phase error itself is used as an evaluation value, for example.

As described above, according to the embodiment of the present invention, it is possible to obtain a more-accurate result in a convergence judgment or the like for measuring performance of a phase-locked loop circuit.

These and other objects, features and advantages of the present invention will become more apparent in light of the following detailed description of best mode embodiments thereof, as illustrated in the accompanying drawings.

DESCRIPTION OF PREFERRED EMBODIMENTS

Hereinafter, an embodiment of the present invention will be described with reference to the drawings in the following order.

<1. PLL measurement system>
(1-1. Overall structure)
(1-2. PLL measurement processing)
　(1-2-1. Convergence judgment processing)
　(1-2-2. Convergence time count)
<2. Disc drive apparatus>
(2-1. Apparatus structure)
(2-2. High-density recording)
<1. PLL Measurement System>
(1-1. Overall Structure)

Figure 1:
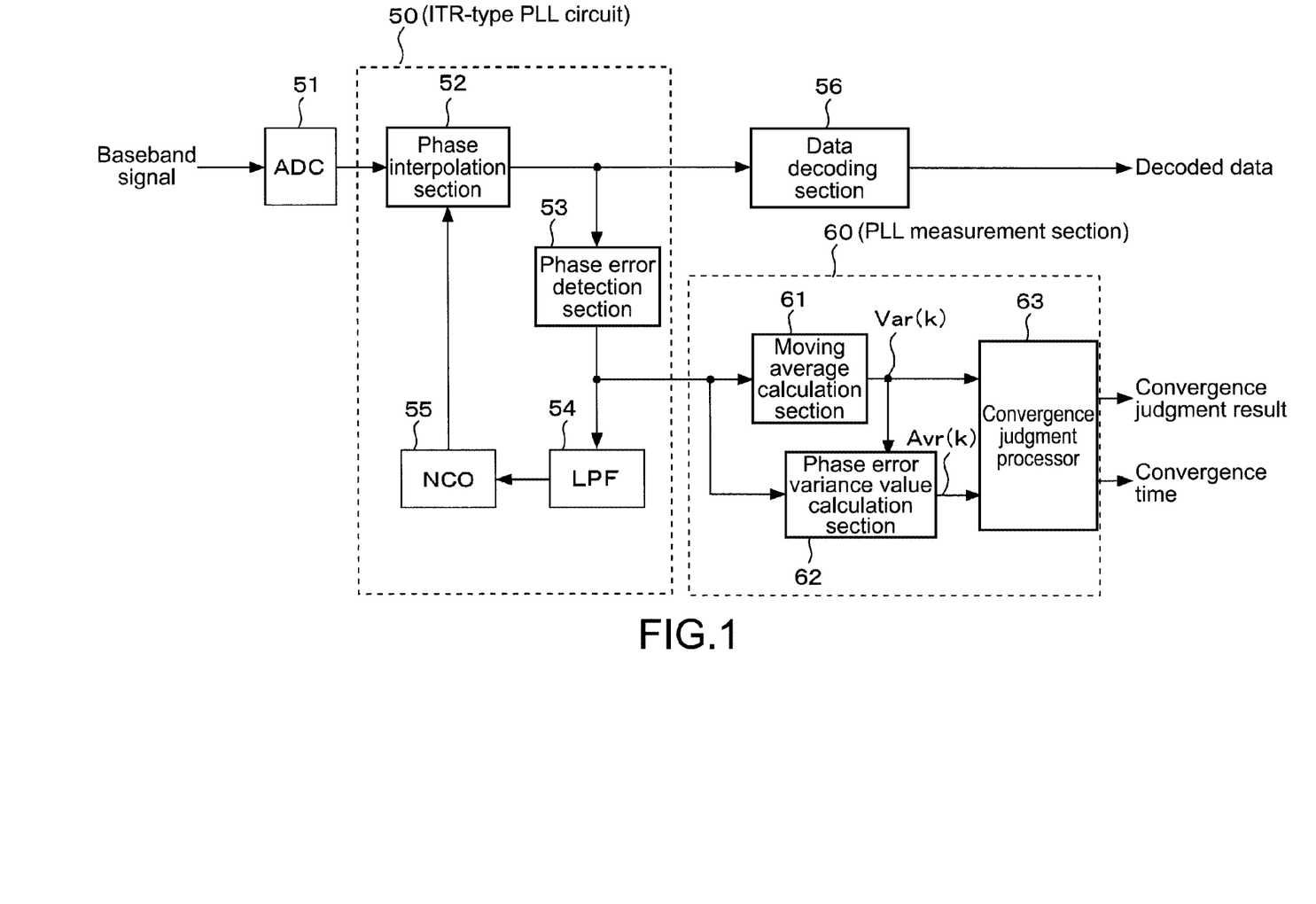
FIG. 1 is a block diagram showing a structural example of a PLL circuit measurement system according to an embodiment of the present invention.

FIG. 1 shows a structural example of a PLL measurement system according to an embodiment of the present invention together with a PLL circuit as a measurement target.

In the figure, the PLL measurement system is illustrated as a PLL measurement section 60.

The PLL measurement section 60 in this case measures a judgment result on whether an ITR-type PLL circuit 50 is converged in a phase-locked state (convergence judgment result) and a time required for the ITR-type PLL circuit 50 to be converged in the locked state since having started a so-called pull-in operation (convergence time).

Here, an analog baseband signal is converted into a digital signal by an ADC (A/D converter) 51 based on a predetermined sampling frequency and quantization bit and input to a phase interpolation section 52 of the ITR-type PLL circuit 50.

The ITR-type PLL circuit 50 is a PLL circuit that is based on an ITR (Interpolated Timing Recovery) system and includes the phase interpolation section 52, a phase error detection section 53, an LPF (Loop Filter) 54, and an NCO (Numerical Controlled Oscillator) 55 as shown in FIG. 1.

The phase interpolation section 52 executes phase interpolation processing on the digitized baseband signal based on a sampling phase output from the NCO 55 and outputs a signal corresponding to an interpolation waveform.

The phase error detection section 53 detects an error with respect to the sampling phase (phase error) for the signal input from the phase interpolation section 52.

Figure 2:
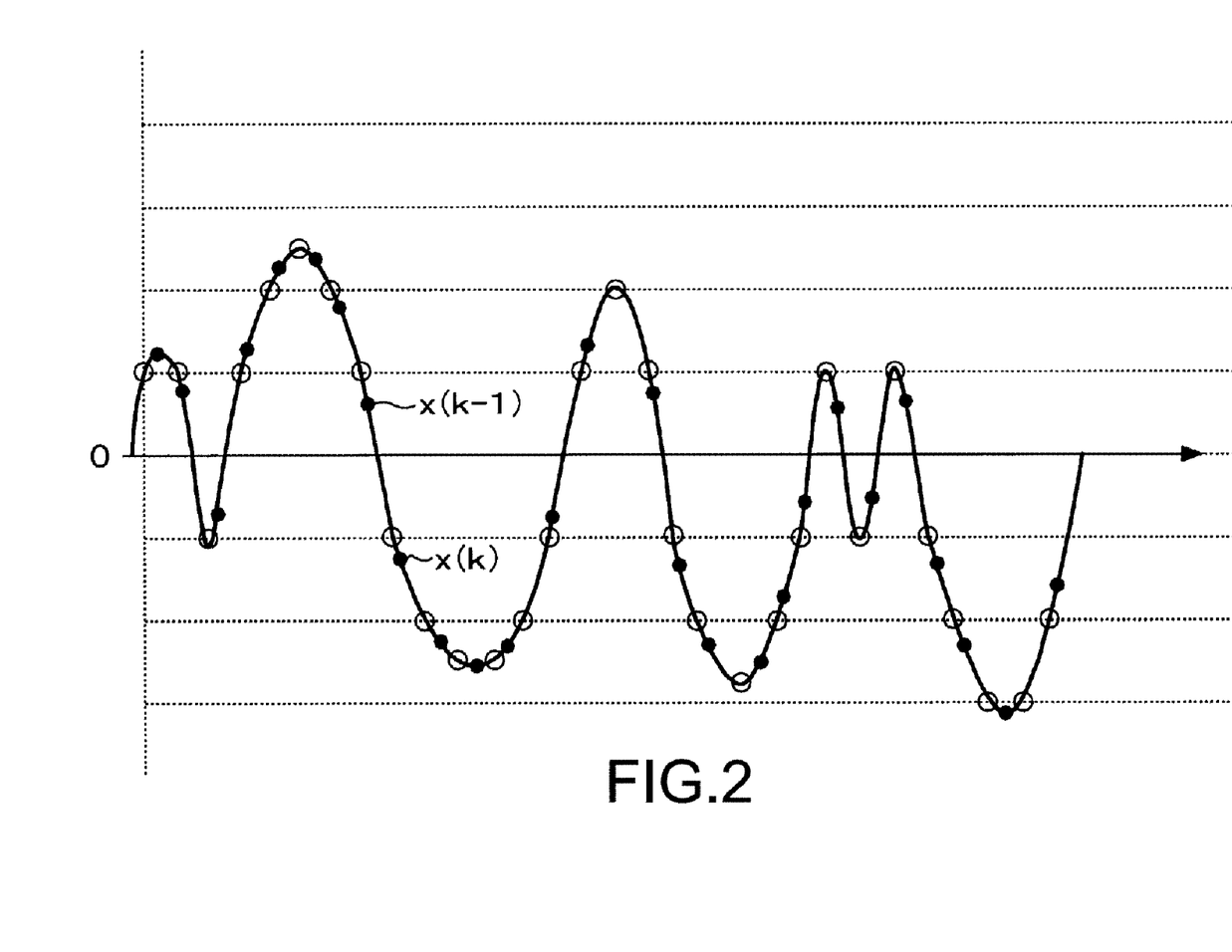
FIG. 2 is a diagram for explaining an example of phase error detection processing.

Various techniques for detecting a phase error by the phase error detection section 53 are conceivable, and an example thereof is shown in FIG. 2.

FIG. 2 shows a baseband signal. The curve in the figure is obtained by linearly connecting sampling points of the baseband signal. Black dots on the curve are sampling points sampled by the ADC 51 and indicate phases of the input signal. The white circles on the curve are sampling points obtained by the phase interpolation processing of the phase interpolation section 52, that is, sampling points corresponding to original sampling phases (reference phases).

Here, sampling points x(k−1) and x(k) shown in FIG. 2 are consecutive points on a sampling time axis, and a 0 level of the baseband signal comes between those values. In other words, the sampling points x(k−1) and x(k) are two consecutive sampling points having a zero-cross point of the baseband signal interposed therebetween (zero-cross-compliant sampling points).

As the phase error detection, using the sampling points x(k−1) and x(k) on both sides of the zero cross, a phase error Pe(k) at a time k is obtained. The phase error Pe(k) can be obtained by the following algorithm.

if (x(k−1)>0, x(k)<0)Pe(k)=−(x(k−1)+x(k))

else if (x(k−1)<0, x(k)>0)Pe(k)=(x(k−1)+x(k))

else Pe(k)=0

Specifically, the phase error Pe(k) is obtained as a difference between the sampling points x(k−1) and x(k) on both sides of the zero cross. The phase error Pe(k) takes a positive value when the phase has progressed and takes a negative value when the phase is delayed. By the way, in the case of the cross sampling points x(k−1) and x(k) on both sides of the zero cross shown in FIG. 2, an absolute value of the sampling point x(k) is larger than that of the sampling point x(k−1), which means that the phase has progressed.

The phase error Pe(k) obtained by the phase error detection section 53 as described above is input to the loop filter 54. The loop filter 54 imparts a band limitation on the phase error Pe(k) and inputs it to the NCO 55.

The NCO 55 integrates a value of the band-limited phase error as an output from the loop filter 54, for example, and outputs a signal indicating a sampling phase. Then, the phase interpolation section 52 executes, at a timing of the sampling phase corresponding to the output of the NCO 55, processing of interpolating the sampling point of the baseband signal.

A signal output from the phase interpolation section 52 becomes a phase-synchronized digital baseband signal in a state where the ITR-type PLL circuit 50 is locked, for example. Then, the output of the phase interpolation section 52 is input to a data decoding section 56 to be subjected to data decoding processing such as Viterbi decoding. As a result, decoded data is obtained.

(1-2. PLL Measurement Processing)

Next, measurement processing executed by the PLL measurement section 60 shown in FIG. 1 will be described.

As shown in the figure, the PLL measurement section 60 includes a moving average calculation section 61, a phase error variance value calculation section 62, and a convergence judgment processor 63.

The moving average calculation section 61 is input with the phase error Pe(k) detected by the phase error detection section 53 of the ITR-type PLL circuit 50 and executes processing of calculating a moving average thereof (phase error moving average).

With a moving average length being represented by N and a time at which the phase error Pe(k) is obtained being represented by k, a value of a phase error moving average Avr(k) at the time (k) can be obtained by Equation 1 below.

$$Avr(k) = \sum_{i=0}^{N-1} Pe(k-1)/N \qquad \text{[Equation 1]}$$

Further, the phase error variance value calculation section 62 is input with the phase error Pe(k) detected by the phase error detection section 53 of the ITR-type PLL circuit 50 and the phase error moving average Avr(k) calculated by the moving average calculation section 61 and executes processing of calculating a variance value of the phase error Pe(k) (phase error variance).

A value of a phase error variance Var(k) at the time (k) can be obtained by calculating Equation 2 below using a value obtained by integrating a square of a difference between the phase error Pe(k) and the phase error moving average Avr(k) (variation) by the moving average length N as a total variation and using the moving average length N as a degree of freedom.

$$Var(k) = \sum_{i=0}^{N-1} (Pe(k) - Avr(k))^2 / N \qquad \text{[Equation 2]}$$

Figures 3A, 3B:
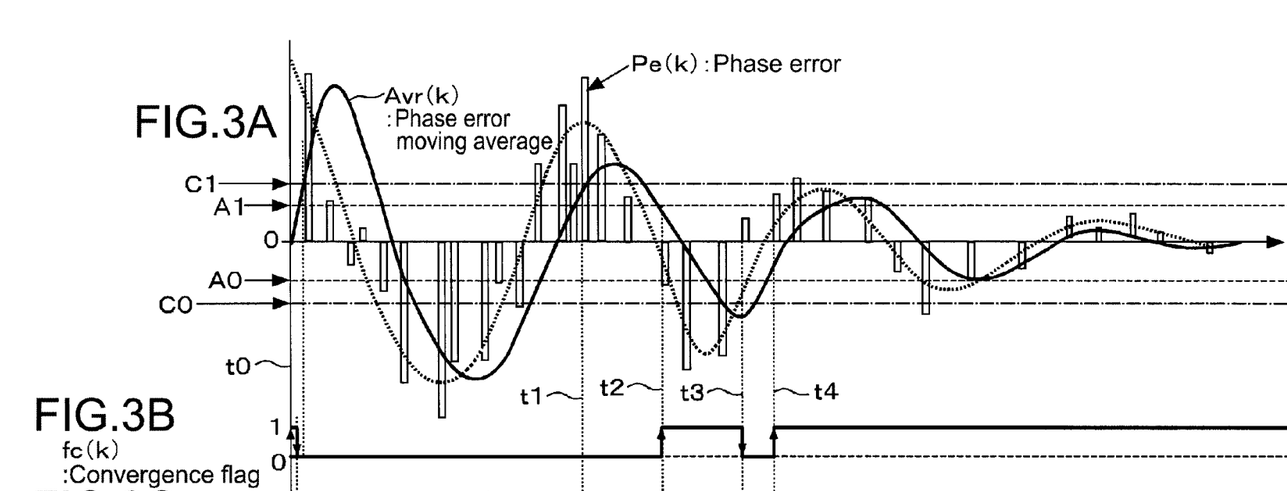
FIG. 3 are timing charts showing an example of judgment processing of a convergence judgment processor.

FIG. 3A shows an example of the phase error Pe(k) obtained with time after a time point at which the ITR-type PLL circuit 50 has started the pull-in operation and an example of the phase error moving average Avr(k) obtained in association with the phase error Pe(k). Moreover, FIG. 3D shows the phase error variance Var(k) calculated based on the phase error Pe(k) and the phase error moving average Avr(k) of FIG. 3A.

As described above with reference to FIG. 2, a timing as the time k at which the phase error Pe(k) is detected by the phase error detection section 53 is only a zero-cross timing of the interpolated baseband signal. Therefore, the phase error Pe(k) shown in FIG. 3A is discrete in a time direction and obtained at inconstant timings.

Here, ideally, an absolute value of the phase error Pe(k) gradually decreases in accordance with the ITR-type PLL circuit 50 being converged in a locked state with time.

However, the phase error Pe(k) shown in FIG. 3A does not gradually decrease, and a state where a value of a phase error Pe(k+1) at a time right after a certain time is larger than that of the phase error Pe(k) at that certain time occurs frequently, for example. This is because the phase error Pe(k) obtained by the method described with reference FIG. 2, for example, contains a reasonable amount of noises and jitters.

As described above, the phase error Pe(k) is obtained at inconstant timings only at times at which the sampling points on both sides of the zero cross of the baseband signal are obtained and contain a reasonable amount of noises and jitters.

This means that it is extremely difficult to obtain an accurate measurement result by directly observing the phase error Pe(k) in measuring performance of the ITR-type PLL circuit 50. For example, even when attempting to judge whether the phase error Pe(k) is converged by merely comparing it with a threshold value, since an error amount due to noises and jitters is larger, it is almost impossible to obtain an accurate judgment result.

The PLL measurement section 60 of this embodiment is structured so that an accurate measurement result on the performance of the PLL circuit can be obtained under the precondition that the phase error Pe(k) itself is unstable as described above.

The phase error moving average Avr(k) of FIG. 3A is indicated by a curve in a solid line. In actuality, the phase error moving average Avr(k) is updated every time the phase error Pe(k) is obtained as can be seen from Equation 1 above. In other words, the phase error moving average Avr(k) is also obtained every time the phase error Pe(k) is detected.

However, since a variation width of the phase error Pe(k) as the phase error moving average Avr(k) in the time direction is suppressed, an envelope formed by connecting the phase error moving averages Avr(k) shows a smooth waveform shape close to a sin wave, a cos wave, and the like as shown in FIG. 3D.

The phase error moving average Avr(k) can be assumed to be indicating a change with time regarding substantially-genuine phase errors in which variations due to noises and jitters of the phase error Pe(k) are suppressed.

It should be noted that in FIG. 3A, to help understand the behavior of the phase error detection in the ITR-type PLL circuit 50, a phase error tendency obtained when assuming that a phase error is obtained at every sampling point of the baseband signal is indicated by the curve in a broken line. The curve indicating the phase error tendency is not actually observed or detected.

For example, it can be seen from comparing the curve indicating the phase error tendency (broken line) and the curve indicating the phase error moving average Avr(k) (solid line) that as a result of calculating the moving average, a phase of the waveform of the phase error moving average Avr(k) shifts later in time than that of the waveform of the phase error tendency. However, as described above, the change of the phase error moving average Avr(k) in the time direction can be expressed by a smooth curve.

Moreover, the phase error variance Var(k) shown in FIG. 3D is an average of a total variation with a differential of the phase error Pe(k) with respect to the phase error moving average Avr(k) as a deviation, and the phase error variance Var(k) indicates a variation tendency of the phase error Pe(k) in the time direction.

As can be seen from FIG. 3D, the phase error variance Var(k) takes a large value when the phase error Pe(k) shows a large variation during the pull-in operation of the PLL circuit. Moreover, while the phase error variance Var(k) is also obtained at every phase error detection timing in actuality, an envelope of those values can be drawn as a smooth curve as shown in the figure.

Any of the variations of the phase error moving average Avr(k) and the phase error variance Var(k) obtained along the time axis suppresses variation components of the phase error Pe(k) due to noises and jitters and indicates a time change of the phase error that is closer to the original convergence state.

(1-2-1. Convergence Judgment Processing)

The phase error moving average Avr(k) and the phase error variance Var(k) described above are input to the convergence judgment processor 63. Based on the phase error moving average Avr(k) and the phase error variance Var(k), the convergence judgment processor 63 judges the PLL performance as follows. As described above, as the PLL performance judgment, the convergence judgment processor 63 performs a convergence judgment on whether the PLL circuit is converged in the locked state and judges a convergence time required for the PLL circuit to be converged in the locked state since the start of the pull-in operation.

As shown in FIG. 3A, the convergence judgment processor 63 sets first threshold values A0 and A1 and second threshold values C0 and C1 for the phase error moving average Avr(k).

The first threshold values A0 and A1 are positive and negative threshold values having the same absolute value.

The second threshold values C0 and C1 are also positive and negative threshold values having the same absolute value, though the absolute value of the second threshold values C0 and C1 is set to be larger than that of the first threshold values A0 and A1.

It should be noted that in a case where an offset is caused in a baseband signal, for example, different absolute values may be set for the first threshold values A0 and A1. The same holds true for the second threshold values C0 and C1.

Further, as shown in FIG. 3D, the convergence judgment processor 63 sets a threshold value B for the phase error variance Var(k).

Figure 4:
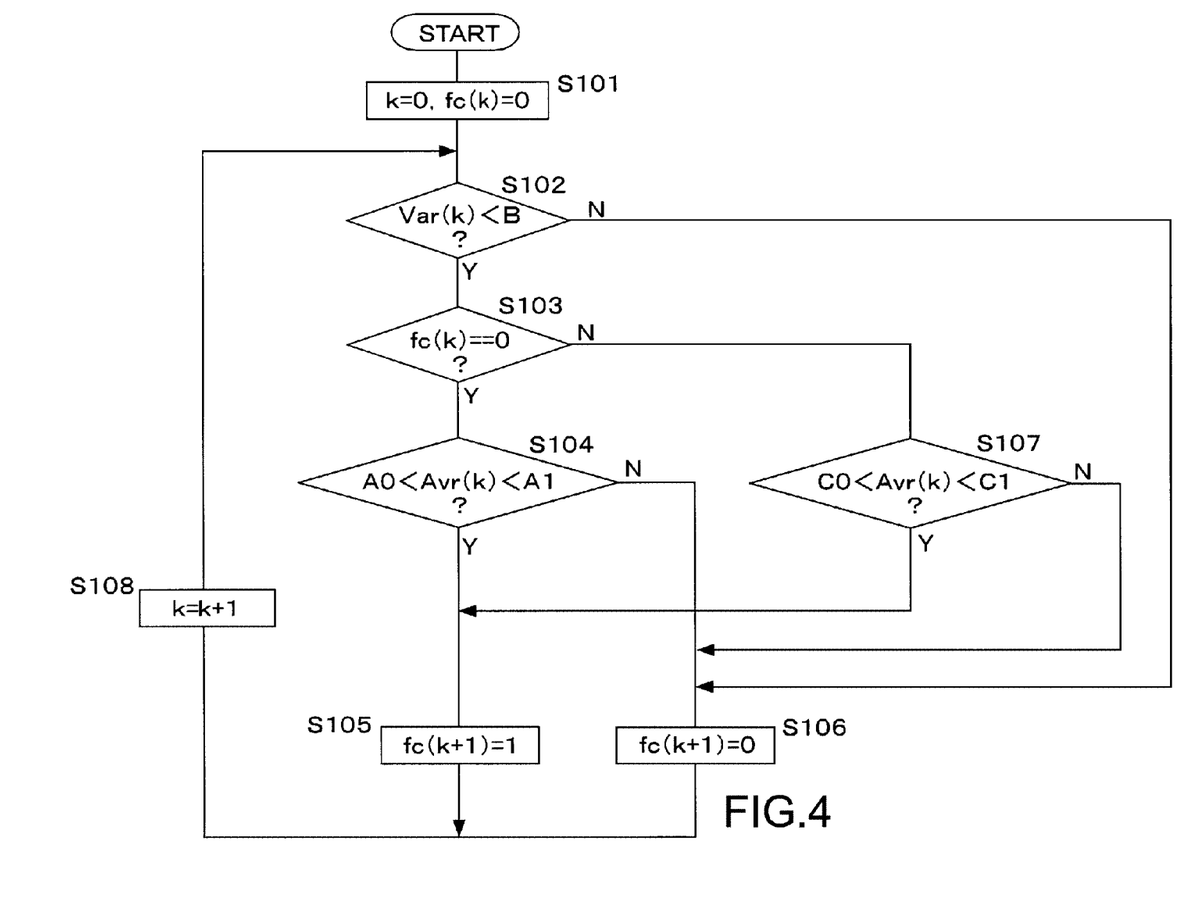
FIG. 4 is a flowchart showing an algorithm for obtaining a convergence judgment result on whether a PLL circuit is converged, as the judgment processing of the convergence judgment processor.

A flowchart of FIG. 4 shows an example of an algorithm for judging whether the PLL circuit is converted (convergence judgment) as judgment processing executed by the convergence judgment processor 63.

The convergence judgment processor 63 starts executing the processing shown in FIG. 4 in accordance with a start of the pull-in operation for putting the ITR-type PLL circuit 50 in the locked state from the unlocked state.

First, in Step S101, as an initial setting, a variable k indicating a current time is substituted with 0. Further, a convergence flag fc(k) is set to 0. The convergence flag fc(k) is a flag indicating a result of the convergence judgment. The convergence flag fc(k) of 0 means that the PLL circuit is not converged in the locked state, and the convergence flag fc(k) of 1 means that the PLL circuit is converged in the locked state. In the initial setting of Step S101, the convergence flag fc(k) is set so as to indicate an unconverged state.

It should be noted that the value of the convergence flag fc(k) becomes an output of the convergence judgment result of the convergence judgment processor 63.

In Step S102, the convergence judgment processor 63 judges whether the phase error variance Var(k) is smaller than the threshold value B.

When the phase error variance Var(k) is equal to or larger than the threshold value B, a variation of the phase error Pe(k) is still large, thus indicating an unconverged state. Therefore, when a negative judgment result is obtained in Step S102, the process advances to Step S106.

In Step S106, a convergence flag fc(k+1) is set to 0 and output. The convergence flag fc(k+1) of 0 indicates a judgment result indicating a nonconvergence in the locked state. On the other hand, the convergence flag fc(k+1) of 1 indicates a judgment result indicating a convergence in the locked state.

As described above, when the phase error variance Var(k) is equal to or larger than the threshold value B, a judgment result indicating a nonconvergence is output irrespective of the value of the phase error moving average Avr(k) to be described next.

On the other hand, when the phase error variance Var(k) is smaller than the threshold value B and a positive judgment result is thus obtained in Step S102, there is a possibility that the PLL circuit is in the converged state. In this case, the process advances to Step S103 to judge whether the convergence flag fc(k) at the current time k is 0. In other words, a judgment is made on which of the judgment result indicating a convergence and the judgment result indicating a nonconvergence has been obtained as the latest convergence judgment result up to this point.

When the convergence flag fc(k) is 0 and a positive judgment result is thus obtained in Step S103, the process advances to Step S104. On the other hand, when the convergence flag fc(k) is 1 and a negative judgment result is thus obtained in Step S103, the process advances to Step S107.

The case where the process advances to Step S104 is a case where, although there is a possibility that the PLL circuit has been converged upon reaching the current time k since the phase error variance Var(k) is smaller than the threshold value B, the PLL circuit is not converged up until the previous time k−1.

In this case, a judgment is made on whether $$A0 < Avr(k) < A1 \quad \text{(Expression 1)}$$

is satisfied as a relationship between the phase error moving average Avr(k) and the first threshold values A0 and A1. In other words, it is judged whether the phase error moving average Avr(k) is within a numerical value range corresponding to the first threshold values A0 to A1.

Here, when Expression 1 above is satisfied and a positive judgment result is thus obtained in Step S104, the process advances to Step S105 to set the convergence flag fc(k+1) to 1. In other words, a judgment result indicating a converged state is generated.

On the other hand, when a negative judgment result is obtained in Step S104, the process advances to Step S106 to set the convergence flag fc(k+1) to 0. In other words, a judgment result indicating an unconverged state is generated.

As described above, in this embodiment, in a case where the phase error variance Var(k) is smaller than the threshold value B and a judgment result indicating an unconverged state is obtained before the current time, a judgment result indicating a convergence is output at a time at which the phase error moving average Avr(k) falls within the numerical value range of the first threshold values A0 to A1 for the first time.

In other words, the first threshold values A0 and A1 are threshold values for judging whether the unconverged state has shifted to the converged state.

Moreover, the case where the process advances to Step S107 is a case where the phase error variance Var(k) is smaller than the threshold value B and a judgment result indicating that the PLL circuit is converged is obtained up to a time before the current time.

In Step S107, a judgment is made on whether $$C0 < Avr(k) < C1 \quad \text{(Expression 2)}$$

is satisfied as a relationship between the phase error moving average Avr(k) and the second threshold values C0 and C1.

When Expression 2 above is satisfied and a positive judgment result is thus obtained in Step S107, the process advances to Step S105. In other words, the judgment result indicating a convergence from before the current time is maintained. On the other hand, when a negative judgment result is obtained in Step S107, the process advances to Step S106 to change the judgment result indicating a convergence from before the current time to a judgment result indicating a nonconvergence.

It can be seen from the procedure described above that the second threshold values C0 and C1 are threshold values for judging whether the converged state has shifted to the unconverged state.

In other words, in this embodiment, different values are set for the first threshold values A0 and A1 for judging whether the unconverged state has shifted to the converged state and the second threshold values C0 and C1 for judging whether the converged state has shifted to the unconverged state. Moreover, as a magnitude relation, the absolute value of the second threshold values C0 and C1 is larger than that of the first threshold values A0 and A1.

By thus setting the first threshold values A0 and A1 and the second threshold values C0 and C1, once the phase error moving average Avr(k) falls within the range of the first threshold values A0 to A1 and the convergence flag fc(k) is set to 1, even when the phase error moving average Avr(k) exceeds the range of the first threshold values A0 to A1, the convergence flag fc(k) is maintained at 1 as long as the phase error moving average Avr(k) is within the range of the second threshold values C0 to C1.

For example, there may be a situation where, even when the PLL circuit is actually converged, the phase error moving average Avr(k) does not fall within the range of the first threshold values A0 to A1 for a given short time due to a temporary oscillation. In this regard, using an algorithm for comparing with the second threshold values C0 and C1 as described above, the convergence flag fc(k) can be maintained at 1 without being affected by such a temporary change in state. In other words, it is possible to prevent an unfavorable behavior in which the judgment result is frequently inverted from occurring.

When either the process of Step S105 or Step S106 is executed, the variable k indicating the time is incremented in Step S108, and the process returns to Step S102.

An operational example of the convergence judgment processor 63 obtained by the processing shown in FIG. 4 will be described while referring to FIG. 3 again. FIG. 3B shows a value of the convergence flag fc(k).

First, in FIG. 3, during a period from a time point t0 at which the ITR-type PLL circuit 50 starts the pull-in operation to a detection timing of the phase error Pe(k) at a time point t1 (phase error detection timing), the phase error variance Var(k) shown in FIG. 3D is equal to or larger than the threshold value B. At this time, a negative judgment result is obtained in Step S102, and the process of Step S106 is executed. Therefore, the convergence flag fc(k) shown in FIG. 3B is 0.

It should be noted that in FIG. 3B, the convergence flag fc(k) at the time point t0 is 1, and the value changes to 0 at a timing right after that. This occurs due to the fact that, at a time the pull-in operation of the PLL circuit is started, a transient period of rise occurs in both of the phase error moving average Avr(k) and the phase error variance Var(k), but since this is insignificant, it is disregarded in this case.

Next, after the time point t1, the phase error variance Var(k) changes to a value smaller than the threshold value B, and a positive judgment result is thus obtained in Step S102. However, since the phase error moving average Avr(k) is equal to or larger than the first threshold value A1 during the period to a time point t2, the process advances to Step S106 after a positive judgment result is obtained in Step S103 and a negative judgment result is obtained in Step S104. Therefore, the convergence flag fc(k) shown in FIG. 3B continues to output 0 from before the time point t1.

Next, the phase error moving average Avr(k) obtained in association with the phase error detection timing at the time point t2 is a positive value smaller than the first threshold value A1. Accordingly, a positive judgment result is obtained for the first time in Step S104 upon reaching the time corresponding to the time point t2, and the process then advances to Step S105. Accordingly, the convergence flag fc(k) changes from 0 to 1 at the time point t2.

In this case, however, an absolute value of the phase error Pe(k) is increased due to, for example, an oscillation during a period to a phase error detection timing at a time point t3. At this time, although the phase error variance Var(k) of FIG. 3D is smaller than the threshold value B, the phase error moving average Avr(k) is out of the range of the second threshold values C0 to C1 at the phase error detection timing at the time point t3.

As described above, the second threshold values C0 and C1 are set for stabilizing the judgment result by imparting hysteresis characteristics to the convergence judgment result.

However, when a state where the phase error moving average Avr(k) is within the range of the second threshold values C0 and C1 is shifted to a state where the phase error moving average Avr(k) is out of the range of the second threshold values C0 and C1 as in the case of the time point t3 of FIG. 3, it is highly likely that the state has returned to the unlocked state. Therefore, when a negative judgment result is obtained in Step S107 of FIG. 4, the convergence flag fc(k) is set to 0 in Step S106. At the timing at the time point t3, the procedure in which the process advances from Step S107 to Step S106 is executed, and the convergence flag fc(k) changes from 1 to 0 as shown in the figure.

Upon reaching a phase error detection timing at a time point t4 after passing the time point t3, the phase error moving average Avr(k) again falls within the range of the first threshold values A0 to A1. Accordingly, at the timing at the time point t4, the process advances to Step S105 after positive judgment results are obtained in Steps S103 and S104. As a result, the convergence flag fc(k) changes from 0 to 1 at the time point t4, and the convergence flag fc(k) continues to output 1 thereafter.

As can be seen from the descriptions above, the value of the convergence flag fc(k) is set based on the phase error moving average Avr(k) and the phase error variance Var(k). In other words, in this embodiment, the convergence judgment is made based on the phase error moving average Avr(k) and the phase error variance Var(k).

As described above, the phase error moving average Avr(k) and the phase error variance Var(k) both remove noise components from the phase error Pe(k) that is temporally discrete and obtained at inconstant timings, and values thereof vary more smoothly in the time direction as shown in FIGS. 3A and 3D. Accordingly, in this embodiment, a more-stable and accurate convergence judgment result can be obtained as compared to the case where the convergence judgment is carried out by directly using the phase error Pe(k), for example.

(1-2-2. Convergence Time Count)

Figure 5:
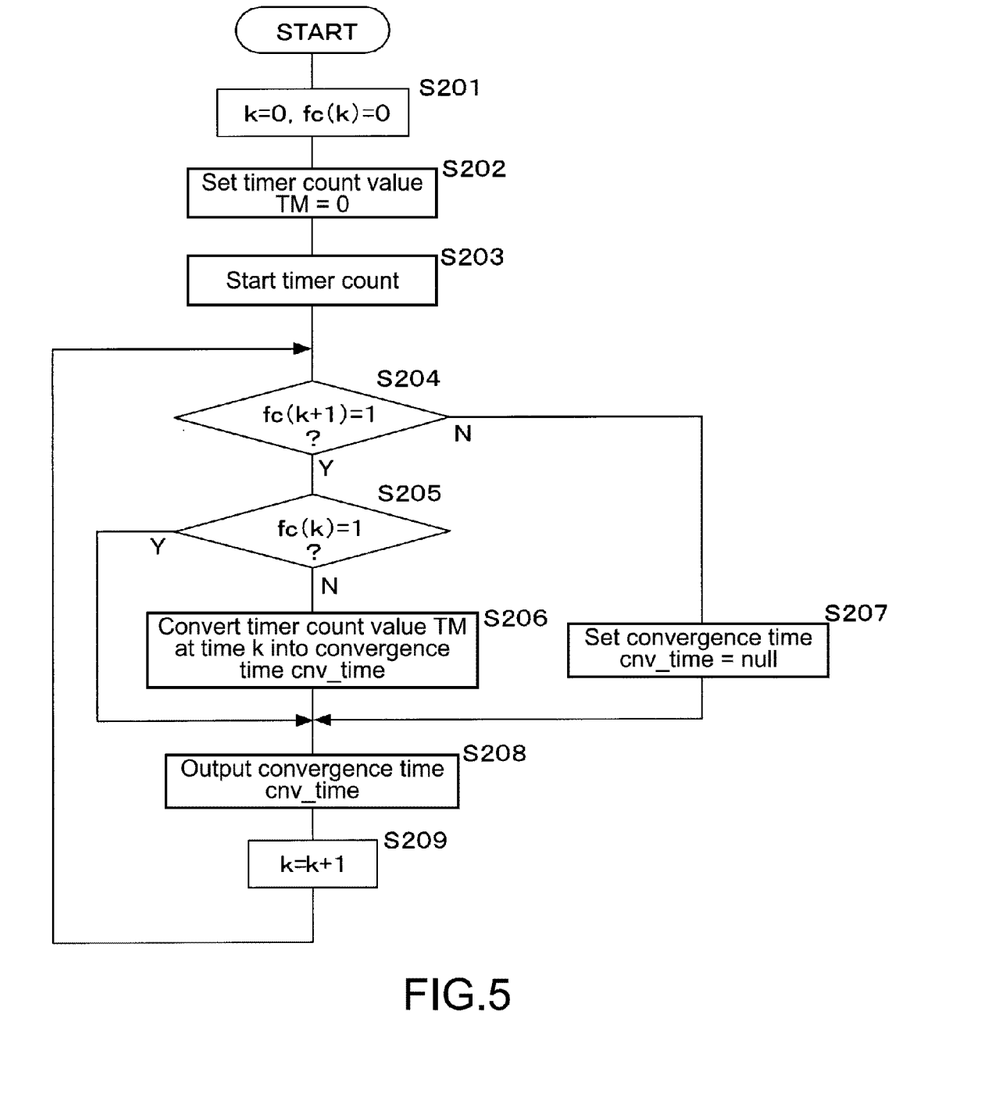
FIG. 5 is a flowchart showing an algorithm for judging a convergence time of the PLL circuit as the judgment processing of the convergence judgment processor.

The flowchart of FIG. 5 shows an example of an algorithm used for the convergence judgment processor 63 to judge a convergence time.

Similar to the processing shown in FIG. 4, the processing shown in FIG. 5 is started in accordance with a start of the pull-in operation of the ITR-type PLL circuit 50 and is executed in parallel to the processing shown in FIG. 4.

In Step S201, the convergence judgment processor 63 substitutes 0 into the variable k indicating the current time as an initial setting and also sets the convergence flag fc(k) to 0, the process of which is the same as that of Step S101 of FIG. 4. Therefore, in actuality, the processes of Steps S101 and S201 only need to be executed as one processing.

In counting a convergence time, the convergence judgment processor 63 uses a timer. In Step S202, the convergence judgment processor 63 sets a count value TM of the timer (timer count value) to 0 as an initial value and starts a count operation of the timer in Step S203. The processes of Steps S201 to S203 are executed in association with a time point at which the pull-in operation is started, and the time point t0 corresponds to the start time point of the pull-in operation in FIG. 3. In other words, in Step S203, a time count is started at the start time point of the pull-in operation.

Processes of Step S204 and subsequent steps are executed every time a phase error detection timing comes, that is, every time the time k passes.

In Step S204, a judgment is made on whether the value of the convergence flag fc(k+1) at a time k+1 obtained in Step S105 or S106 of FIG. 4, that is, the latest convergence flag at the current time point is 1.

First, when a negative judgment result is obtained in Step S204, the process advances to Step S207. Here, the value of the convergence time counted by the convergence judgment processor 63 is represented by cnv_time. The convergence judgment processor 63 outputs the value of cnv_time as a result of counting the convergence time.

Then, in Step S207, the convergence time cnv_time is set to a value null. Here, the convergence time cnv_time of null means that that value is ineffective and is to be output in accordance with the unconverged state.

On the other hand, when a positive judgment result is obtained in Step S204, it is judged in Step S205 whether the convergence flag fc(k) at the time k right before the convergence flag fc(k+1) at the time k+1 is 1.

First, when the convergence flag fc(k) is 0 and a negative judgment result is thus obtained in Step S205, it indicates that the convergence flag has changed to 1 upon reaching the current time from the state where the convergence flag has been 0 at the previous time. This means that although a judgment result indicating a nonconvergence has been obtained before the current time, the judgment result has changed to the judgment result indicating a convergence upon reaching the current time.

In this case, the process advances to Step S206 to convert the timer count value TM at the current time k into a time value. The time value obtained by the conversion indicates a time required for the PLL circuit to be converged since the start time point of the pull-in operation corresponding to the time point t0 in FIG. 3. In other words, the time value is the convergence time cnv_time.

Moreover, when a positive judgment result is obtained in Step S205, it means that the convergence flag is 1 and has not changed since the previous time. In other words, the judgment result indicating a convergence is maintained from before the current time.

In this case, the process of Step S206 is skipped, and the process advances to Step S208. Here, skipping Step S206 corresponds to a process of maintaining the convergence time cnv_time without changing the value output at the previous time.

Reaching the stage of Step S208 means that a new convergence time cnv_time is set in Step S206, the convergence time cnv_time is set to a value null in Step S207, or Step S206 is skipped and the value of the convergence time cnv_time at the previous time is maintained by directly transiting from Step S205.

In Step S208, the convergence judgment processor 63 outputs the value of the convergence time cnv_time set at this stage as a result of counting the convergence time.

Next, the convergence judgment processor 63 increments the variable k in Step S209 and returns to Step S204.

An operational example of the convergence judgment processor 63 obtained by the processing shown in FIG. 5 above will be described with reference to FIG. 3. The convergence time cnv_time is shown in FIG. 3C.

Figure 3C:
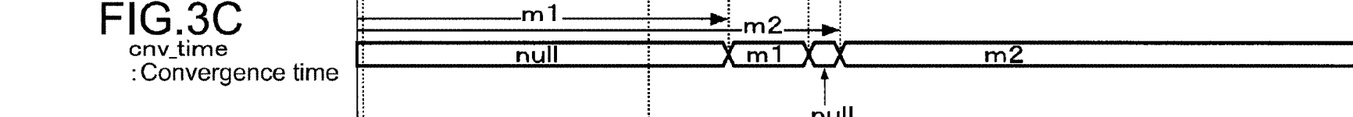
Figure 3D:
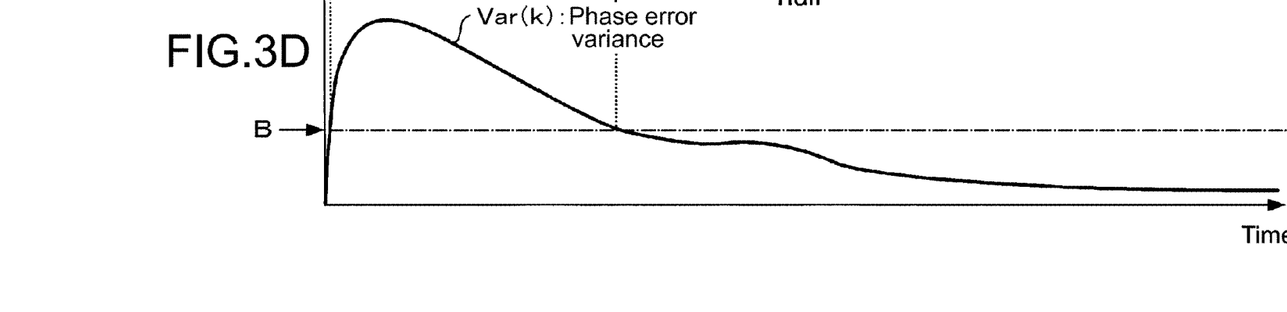

First, in FIG. 3, during a period from the time point t0 to the time point t2, the convergence flag fc(k) is maintained at 0 (convergence flag fc(k) of 1 at time point t0 is disregarded as being insignificant). Accordingly, at the phase error detection timings during the period t0 to t2, a negative judgment result is obtained in Step S204, and the process of Step S207 is thus executed. Thus, as shown in FIG. 3C, a state where the convergence time cnv_time is null continues during the period t0 to t2.

Subsequently, at the timing of reaching the time point t2, the convergence flag fc(k) is changed to 1 as a significant value. Accordingly, at the phase error detection timing corresponding to the time point t2, a positive judgment result is obtained in Step S204 and a negative judgment result is obtained in Step S205 so that the process advances to Step S206, and an output of the convergence time cnv_time is thus switched to a value indicating a time m1 from the time point t0 to the time point t2. After that, the convergence flag fc(k) is maintained at 1 until reaching the time point t3. Accordingly, as the processing shown in FIG. 5, positive judgment results are obtained in Steps S204 and S205 so that Step S206 is skipped and the process advances to Step S208 while maintaining the convergence time cnv_time at the previous time. As a result, the convergence time cnv_time is set to m1 and output during a period from the time point t2 to the time point t3.

Next, during a period from the time point t3 to the time point t4, the convergence flag fc(k) is again changed to 0. Accordingly, as the processing of FIG. 5 during the period from the time point t3 to the time point t4, a negative judgment result is obtained in Step S204 so that the process advances to Step S207, and the convergence time cnv_time of null is continued to be output.

At the time point t4, the convergence flag fc(k) again changes to 1. Accordingly, at the phase error detection timing corresponding to the time point t4, the process of Step S206 is executed. As a result, a time m2 corresponding to the period from the time point t0 to the time point t4 is output as the convergence time cnv_time.

After the time point t4, the output of the convergence time cnv_time of m2 is continued in accordance with the continuation of the convergence flag fc(k) of 1.

As described above, the convergence time cnv_time is determined in association with the convergence flag fc(k). As described above, the convergence flag fc(k) set based on the phase error moving average Avr(k) and the phase error variance Var(k), that is, the convergence judgment result is accurate and stable. Therefore, the convergence time cnv_time also becomes an accurate value corresponding to an actual convergence state.

<2. Disc Drive Apparatus>
(2-1. Apparatus Structure)

Although the PLL measurement section 60 described above with reference to FIGS. 1 to 5 can be structured as an independent measurement apparatus, for example, it is also applicable to an apparatus that includes a PLL circuit for synchronizing a reproduction signal and the like.

Figure 6:
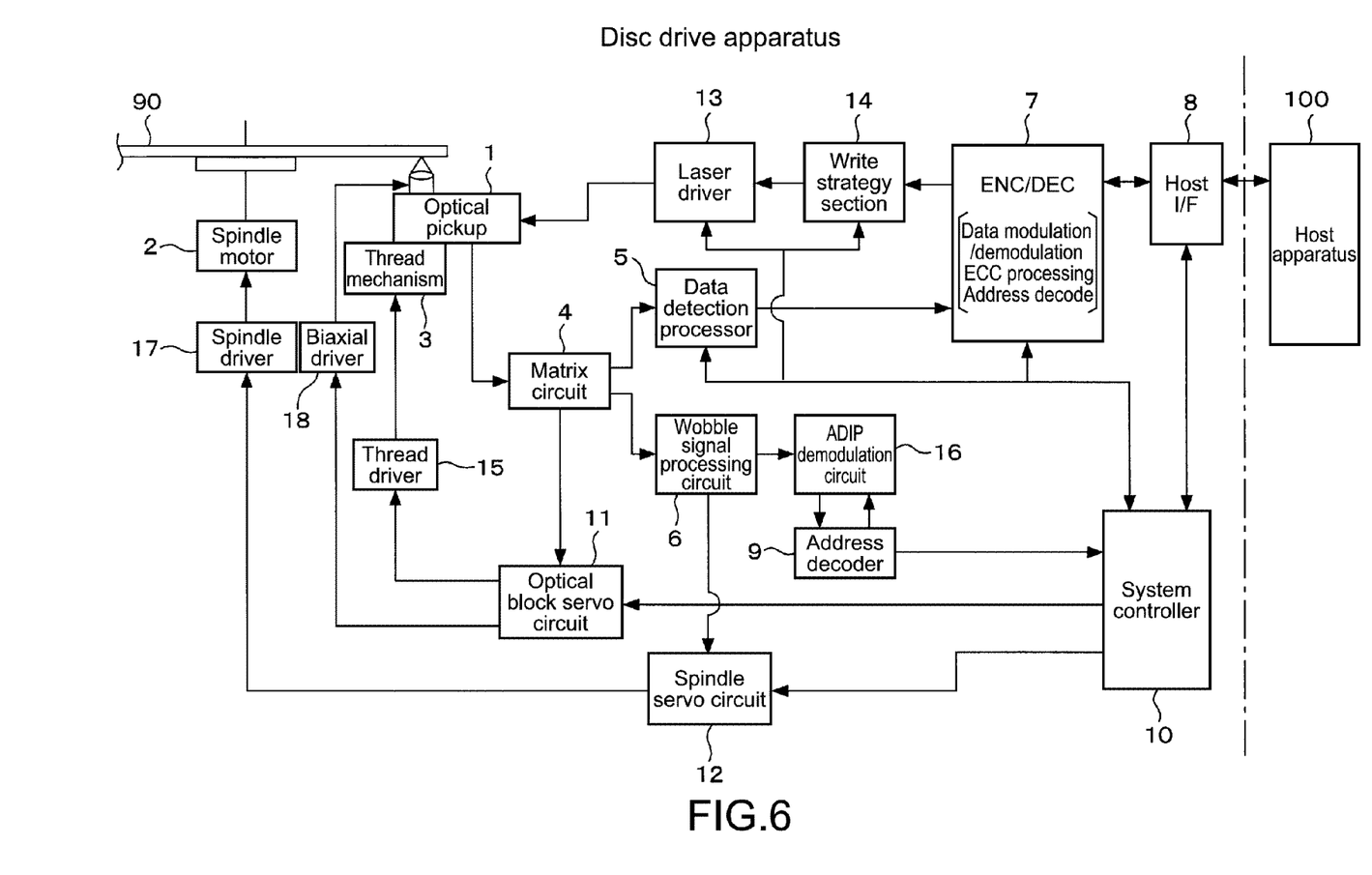
FIG. 6 is a diagram showing a structural example of a disc drive apparatus on which a PLL measurement section according to the embodiment is mounted.

FIG. 6 shows a structural example of a disc drive apparatus for performing recording and reproduction with respect to an optical disc, as an example of a reproduction apparatus including the PLL measurement section 60 as described above.

It should be noted that the disc drive apparatus shown in the figure is capable of performing recording and reproduction with respect to a read-only disc such as a Blu-ray disc (registered trademark; hereinafter referred to as BD) and a recordable disc (write-once disc and rewritable disc).

An optical disc 90 shown in FIG. 6 is a disc-like recording medium having a BD format.

The optical disc 90 is mounted on a turntable (not shown) when loaded in the disc drive apparatus and is rotationally driven at a constant linear velocity (CLV) by a spindle motor 2 during a recording/reproduction operation.

During reproduction, information recorded on a track on the optical disc 90 is read out by an optical pickup (optical head) 1.

Further, during recording of data onto the optical disc 90, user data is recorded onto the track of the optical disc 90 by the optical pickup 1 as a phase change mark or a dye change mark.

It should be noted that in an inner circumferential area 91 of the optical disc 90 or the like, physical information of a disc, for example, is recorded as read-only management information by emboss pits or wobbling grooves, but read-out of the information is also performed by the optical pickup 1.

In addition, ADIP information embedded as wobbling of a groove track on the optical disc 90 is also read out from the optical disc 90 by the optical pickup 1.

Inside the optical pickup 1, a laser diode to be a laser light source, a photodetector for detecting reflected light, and an objective lens to be an output end of laser light are provided. Moreover, an optical system and the like for irradiating laser light onto a disc recording surface via the objective lens and guiding reflected light to the photodetector is formed. The laser diode outputs so-called blue laser having a wavelength of, for example, 405 nm. An NA of the optical system is 0.85.

The objective lens is held while being movable in a tracking direction and a focus direction by a biaxial mechanism inside the optical pickup 1.

Further, the entire optical pickup 1 is movable in a disc radial direction by a thread mechanism 3.

Furthermore, the laser diode in the optical pickup 1 is driven to emit light by a drive signal (drive current) from a laser driver 13.

Reflected light information from the optical disc 90 is detected by the photodetector, converted into an electrical signal corresponding to a received-light amount, and supplied to a matrix circuit 4.

The matrix circuit 4 includes a current-voltage conversion circuit, a matrix operation/amplifier circuit, and the like in association with an output current from a plurality of light-receiving devices each as the photodetector, and generates signals necessary for matrix operation processing.

For example, the matrix circuit 4 generates a reproduction information signal (RF signal) corresponding to reproduction data and a focus error signal and a tracking error signal for servo control.

The matrix circuit 4 also generates a push-pull signal as a signal related to groove wobbling, that is, a signal for detecting wobbling.

The reproduction information signal output from the matrix circuit 4 is supplied to a data detection processor 5, the focus error signal and the tracking error signal are supplied to an optical block servo circuit 11, and the push-pull signal is supplied to a wobble signal processing circuit 6.

The data detection processor 5 carries out binarization processing on the reproduction information signal.

The data detection processor 5 carries out A/D conversion processing of an RF signal, synchronization processing of a reproduction signal by PLL, PR (Partial Response) equalization processing, Viterbi decoding (maximum-likelihood decoding), and the like and obtains a binary data string by partial response maximum-likelihood decoding processing (PRML detection method: Partial Response Maximum-Likelihood detection method).

The A/D converter 51, the ITR-type PLL circuit 50, the data decoding section 56, and the PLL measurement section 60 shown in FIG. 1 are included in the data detection processor 5.

In the data detection processor 5, the A/D converter 51 inputs, as an analog baseband signal, the RF signal gain-adjusted by an AGC (Automatic Gain Control), for example, converts it into a digital signal, and outputs it to the ITR-type PLL circuit 50. As described above, the ITR-type PLL circuit 50 synchronizes the digital baseband signal and outputs it to the data decoding section 56. The data decoding section 56 executes signal processing according to, for example, the PRML detection method and outputs a binary data string obtained by the Viterbi decoding as decoded data. The binary data string is supplied to a subsequent encode/decode section 7 shown in FIG. 6.

The encode/decode section 7 carries out demodulation processing of reproduction data during reproduction and modulation processing of recording data during recording. In other words, the encode/decode section 7 carries out data demodulation, de-interleave, ECC decoding, address decoding, and the like during reproduction and ECC encoding, interleave, data modulation, and the like during recording.

During reproduction, the binary data string decoded by the data detection processor 5 is supplied to the encode/decode section 7. The encode/decode section 7 carries out decoding processing on the binary data string and obtains reproduction data from the optical disc 90. In other words, demodulation processing of data recorded onto the optical disc 90 by being subjected to RLL(1-7)PP modulation and ECC decoding processing for error correction are carried out to obtain reproduction data from the optical disc 90.

The reproduction data obtained by decoding the data in the encode/decode section 7 is transferred to a host interface 8 and further transferred to a host apparatus 100 based on an instruction from a system controller 10. Examples of the host apparatus 100 include a computer apparatus and an AV (Audio-Visual) system apparatus.

During recording and reproduction with respect to the optical disc 90, processing of ADIP information is carried out.

Specifically, the push-pull signal output from the matrix circuit 4 as a signal on groove wobbling becomes wobble data digitized in the wobble signal processing circuit 6. The wobble signal processing circuit 6 generates clocks synchronized with the push-pull signal by the internal PLL circuit.

The wobble data is subjected to MSK modulation and STW demodulation in an ADIP demodulation circuit 16, demodulated into a data stream constituting an ADIP address, and supplied to an address decoder 9.

The address decoder 9 decodes the supplied data and supplies an address value obtained by the decode to the system controller 10.

During recording, the recording data transferred from the host apparatus 100 is supplied to the encode/decode section 7 via the host interface 8.

The encode/decode section 7 in this case performs error correction code addition (ECC encode), interleave, subcode addition, and the like as recording data encoding processing. Moreover, the encode/decode section 7 performs RLL(1-7) PP modulation on data that has been subjected to the processing described above.

Recording data processed by the encode/decode section 7 is subjected to recording compensation processing in a write strategy section 14. Specifically, recording data is supplied to the laser driver 13 as a laser drive pulse whose optimal recording power with respect to characteristics of a recording layer, a spot shape of laser light, a recording linear velocity, and the like has been finely adjusted and whose laser drive pulse waveform has also been adjusted.

The laser driver 13 imparts the laser drive pulse subjected to the recording compensation processing to the laser diode inside the optical pickup 1 to execute laser emission drive. Accordingly, a mark corresponding to the recording data is formed on the optical disc 90.

It should be noted that the laser driver 13 includes a so-called APC (Auto Power Control) circuit and controls a laser output to be constant irrespective of a temperature or the like while monitoring laser output power by an output of a laser power monitor detector provided inside the optical pickup 1. Target values of laser outputs for recording and reproduction are given from the system controller 10, and laser output levels are controlled to be target values during recording and reproduction.

The optical block servo circuit 11 generates various servo drive signals of focus, tracking, and thread from a focus error signal and a tracking error signal from the matrix circuit 4 to thus execute a servo operation.

In other words, a focus drive signal and a tracking drive signal are generated based on the focus error signal and the tracking error signal to drive a focus coil and a tracking coil of the biaxial mechanism inside the optical pickup 1 by a biaxial driver 18. Accordingly, a tracking servo loop and a focus servo loop are formed by the optical pickup 1, the matrix circuit 4, the optical block servo circuit 11, the biaxial driver 18, and the biaxial mechanism.

Further, the optical block servo circuit 11 turns off the tracking servo loop in response to a track jump command from the system controller 10 and outputs a jump drive signal to execute a track jump operation.

Furthermore, the optical block servo circuit 11 generates a thread error signal obtained as a low-frequency component of the tracking error signal and a thread drive signal that is based on access execution control from the system controller 10 and the like. Then, a thread driver 15 drives the thread mechanism 3 based on the thread drive signal. Although not shown, the thread mechanism 3 includes a mechanism constituted of a main shaft for holding the optical pickup 1, a thread motor, a transmission gear, and the like. By the thread mechanism 3 driving the thread motor in response to the thread drive signal, a predetermined slide movement of the optical pickup 1 is performed.

A spindle servo circuit 12 performs control to CLV-rotate the spindle motor 2.

The spindle servo circuit 12 obtains clocks generated by the PLL processing on a wobble signal as current rotating velocity information of the spindle motor 2 and compares it with predetermined CLV reference velocity information to generate a spindle error signal.

Moreover, since reproduction clocks generated by the PLL of the data detection processor 5 become the current rotating velocity information of the spindle motor 2 during data reproduction, the spindle error signal can also be generated by comparing the clocks with the predetermined CLV reference velocity information.

Then, the spindle servo circuit 12 outputs a spindle drive signal generated based on the spindle error signal and causes a spindle driver 17 to execute a CLV rotation of the spindle motor 2.

Further, the spindle servo circuit 12 generates a spindle drive signal in response to a spindle kick/brake control signal from the system controller 10 and also causes an operation of activation, stop, acceleration, deceleration, and the like of the spindle motor 2 to be executed.

The operations of the servo system and the recording/reproduction system as described above are controlled by the system controller 10 constituted of a microcomputer.

The system controller 10 executes various types of processing in response to commands from the host apparatus 100 transferred via the host interface 8.

For example, upon output of a write command from the host apparatus 100, the system controller 10 first moves the optical pickup 1 to an address at which write is to be performed. Then, the system controller 10 causes the encode/decode section 7 to execute the encoding processing as described above on the data (e.g., video data and audio data) transferred from the host apparatus 100. Then, recording is executed by the laser emission drive by the laser driver 13 according to the data encoded as described above.

Moreover, when a read command that requests certain data recorded onto the optical disc 90 to be transferred is supplied from the host apparatus 100, for example, the system controller 10 first performs seek operation control targeting an instructed address. In other words, a command is output to the optical block servo circuit 11 to thus cause an access operation of the optical pickup 1 targeting an address designated by a seek command to be executed.

After that, operation control necessary for transferring data of the designated data section to the host apparatus 100 is performed. Specifically, data is read out from the optical disc 90 and the data detection processor 5 and the encode/decode section 7 are caused to execute reproduction processing so as to transfer requested data.

It should be noted that although the disc drive apparatus has been described as being connected to the host apparatus 100 in the example of FIG. 6, a structure in which the disc drive apparatus is not connected to another apparatus is also possible. In this case, an operation section or a display section is provided, or a structure of an interface portion for a data input/output is differed from that of FIG. 6. Specifically, it is only necessary to form a terminal section for inputting and outputting various types of data as well as perform recording and reproduction in accordance with a user operation. Various other structures may of course be adopted as the structural example of the disc drive apparatus.

(2-2. High-density Recording)

The optical disc supported by the disc drive apparatus shown in FIG. 6 is a disc of a BD format as described above.

Under current recording/reproduction conditions specified for the BD format (legitimate recording/reproduction conditions), a recording capacity per layer is 25 GB. However, realization of recording of a higher density by using the current BD format but with conditions different from the legitimate recording/reproduction conditions (extended recording/reproduction conditions) is being discussed.

As an example, a recording/reproduction condition on a linear velocity is lowered as compared to the legitimate condition. Accordingly, a recording pattern cycle, that is, a physical mark length is shortened. As a result, a recording capacity per layer is extended to, for example, about 30 GB to 33 GB.

Here, reproduction characteristics of an optical recording/reproduction apparatus are determined based on a laser wavelength $\lambda$ (nm) and a numerical aperture NA of an optical pickup.

A diffraction barrier Sc exists in the reproduction characteristics, and a reproduction waveform equal to or larger than a spatial frequency that is determined by $Sc (1/m)=2*NA/\lambda$ cannot be read out. However, since a unit of the diffraction barrier in the equation is the spatial frequency, an actual diffraction barrier frequency fc that can be read out by an optical system is obtained by multiplying a disc linear velocity v (m/sec) in $fc=Sc*v$.

Figure 7:
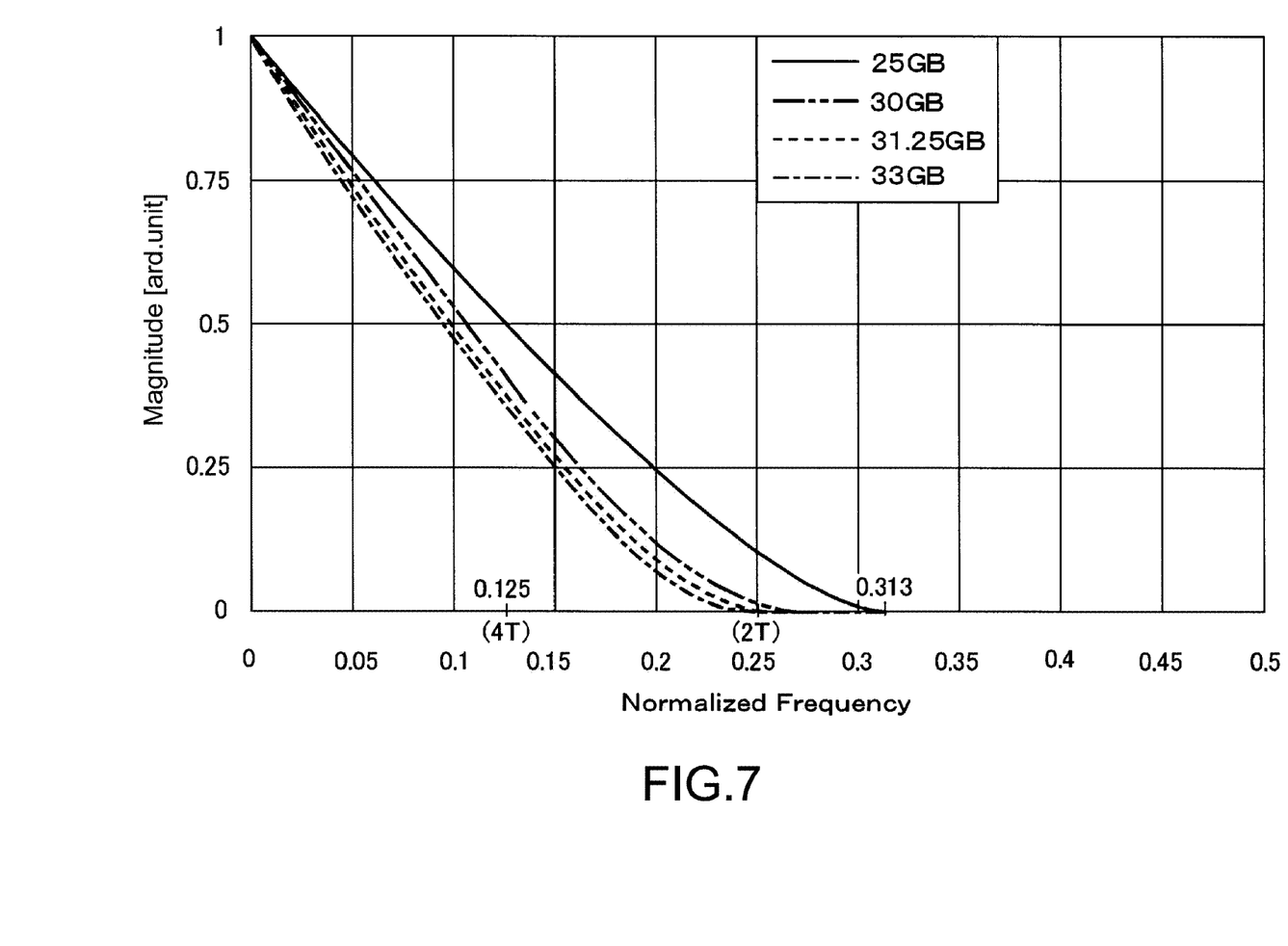
FIG. 7 is a diagram of an MTF (Modulation Transfer Function) that takes into account high-density recording.

Optical reproduction characteristics obtained by standardizing (normalizing) the reproduction frequency by a channel frequency (fs) corresponding to a data transfer bit rate are expressed by an MTF (Modulation Transfer Function) shown in FIG. 7.

In the current BD format having a capacity of 25 GB per layer, with $\lambda$ of 405 nm and NA of 0.85, a physical length of 2T (shortest mark length) becomes 149 nm based on v=4.917 m/sec. Moreover, since the data transfer bit rate fs is 66 MHz, a rate of the diffraction barrier frequency to the data bit rate, that is, the standardized diffraction barrier frequency fc/fs becomes 0.313.

In the BD format, data is modulated using the RLL(1-7)PP coding, and 2T becomes the shortest wavelength (shortest recording mark). A standardized frequency of the shortest wavelength (2T) is 1/2*2=0.2.

In this case, the standardized frequency of 2T is as low as about 0.05 with respect to a standardized diffraction barrier frequency at a time a recording data amount is 25 GB. This means that 2T data can be reproduced sufficiently.

Next, a case where, assuming that recording of a higher density is to be performed with the same channel frequency under the same BD format, a linear velocity is lowered for recording will be discussed.

When a recording data amount with which the standardized diffraction barrier frequency coincides with the standardized 2T frequency is obtained, the recording data amount becomes 31.25 GB as indicated by the dotted line of FIG. 7.

In addition, when the linear velocity is lowered so as to obtain a recording data capacity of 30 GB, the standardized diffraction barrier frequency becomes larger than the standardized 2T frequency but smaller than the case of 25 GB under the legitimate condition.

Furthermore, when the linear velocity is lowered in accordance with a recording data amount of a data size of 32 GB or 33 GB, for example, the standardized diffraction barrier frequency becomes smaller than the standardized 2T frequency.

With the characteristics corresponding to the recording data amount of 32 GB and 33 GB described above, reproduction data of the shortest wavelength cannot be obtained according to the descriptions above.

However, in actuality, as a method of reproducing high-density recording data, it is known that if signal processing based on PRML or the like is used, even when the diffraction barrier frequency becomes smaller than the 2T frequency (0.25), data of the shortest wavelength (2T) can be reproduced.

As described above, the disc drive apparatus of this embodiment obtains decoded data in the data detection processor 5 using the PRML detection method. Therefore, the disc drive apparatus of this embodiment is not only capable of being structured to perform 25-GB-per-layer recording corresponding to the current BD format as it is, but is also capable of being structured to record a data amount larger than 25 GB.

It should be noted that based on a relationship between the standardized 2T frequency and the standardized diffraction barrier frequency, the characteristics shown in FIG. 7 can be expressed by the following expression.

$$\text{2T spatial frequency/diffraction barrier spatial frequency} \quad \text{(Expression 3)}$$

With the physical mark length of 2T being represented by M, the 2T spatial frequency can be obtained by calculating the following expression.

$$1/M*2*1000000000/m \quad \text{(Expression 4)}$$

The physical mark length M of 2T can be obtained uniquely according to the linear velocity (m/s) determined based on the recording data amount. The diffraction barrier spatial frequency is Sc.

If 2T spatial frequency/diffraction barrier spatial frequency obtained in association with a certain recording data amount is smaller than 1, it means that the diffraction barrier frequency is larger than the reference 2T frequency. On the other hand, if 2T spatial frequency/diffraction barrier spatial frequency is larger than 1, it means that the diffraction barrier frequency is smaller than the reference 2T frequency.

By the way, the value of 2T spatial frequency/diffraction barrier spatial frequency is a value that practically matches the following expression.

$$\text{Standardized 2T frequency (0.25)/standardized diffraction barrier frequency} \quad \text{(Expression 5)}$$

As a reference, the linear velocity v as the recording/reproduction condition corresponding to the recording data amount of 30 GB is 4.0975. Accordingly, the shortest mark length M becomes 124.97 nm. The value of 2T spatial frequency/diffraction barrier spatial frequency becomes $(1/124.97*2*1000000000)/4.198E+06=0.95838$. Thus, it can be said that the value of 2T spatial frequency/diffraction barrier spatial frequency satisfies the condition of 0.95 or more, for example.

It should be noted that although a high recording density is realized by lowering the linear velocity as compared to the legitimate linear velocity in the example above, it is also possible to realize the high recording density by shortening the mark length by changing the recording/reproduction condition on a channel frequency to be high.

Here, when evaluating a reproduction signal in reproducing an optical disc in the case of a disc drive apparatus that does not include the PLL measurement section 60 of this embodiment, for example, an error rate obtained by the encode/decode section 7 is used, for example. However, as a cause of the lowering of the error rate, there is, for example, a situation where the PLL circuit is in midst of a converging process and is not yet sufficiently converged.

For example, assuming that the disc drive apparatus executes some kind of control using the error rate measured under the presupposition that the PLL circuit is converged in the locked state, in the case of the disc drive apparatus not including the PLL measurement section 60, a judgment on whether the PLL circuit is converged in the locked state cannot be made. Therefore, in actuality, the error rate measured in the state where the PLL circuit is not converged is used for the control, with the result that an operation corresponding to appropriate control may not be obtained in this case.

On the other hand, according to the disc drive apparatus including the PLL measurement section 60 according to this embodiment, whether the PLL circuit is currently in the converged state can be recognized based on the convergence judgment result (convergence flag fc(k)) output by the PLL measurement section 60. Therefore, in performing control based on the error rate, for example, it is possible to regard the error rate as significant only when it is judged that the PLL circuit is converged based on the convergence flag fc(k). Accordingly, an appropriate control operation can be secured.

The way of using the measurement result of the PLL measurement section 60 herein is a mere example.

Together with the convergence judgment result (convergence flag fc(k)), the convergence time cnv_time can also be measured and output from the PLL measurement section 60 of this embodiment. The disc drive apparatus is capable of executing control and processing that also use the convergence time cnv_time. As one example, the convergence time cnv_time can be used for a parameter setting at a time of starting reproduction, which is called calibration. For example, it can be evaluated that reading out of a signal from an optical disc becomes more favorable as the convergence time cnv_time becomes shorter. In this regard, by setting a parameter such that the convergence time cnv_time becomes the shortest, a best reproduction condition can be obtained.

Moreover, what kind of a measurement result of the PLL measurement section 60 is used for what kind of control and processing by the disc drive apparatus is not limited and can be varied.

Further, in the example on the error rate above, the error rate is used for the control after the convergence judgment result is obtained by the PLL measurement section 60. In other words, a measurement result of the PLL measurement section 60 is used earlier in time, and an evaluation value obtained by a section other than the PLL measurement section 60, such as an error rate, is used after that. In addition, evaluation processing and control that use the measurement result of the PLL measurement section 60 and a measurement result other than that at the same time are also possible, for example. Moreover, processing and control that use the measurement result of the PLL measurement section 60 later in time and use a measurement value and evaluation value obtained from sections other than the PLL measurement section 60 earlier in time are also possible.

Further, as described above, the disc drive apparatus of this embodiment is capable of not only performing recording and reproduction corresponding to a current recording capacity of 25 GB as the BD format, but also performing recording and reproduction corresponding to a recording capacity exceeding 25 GB by changing a linear velocity or a channel frequency under the current BD format, for example.

The PLL measurement section 60 is useful for recording and reproduction in both the recording capacity corresponding to the legitimate recording/reproduction conditions (25 GB) and a recording capacity larger than the legitimate capacity, that corresponds to the extended recording/reproduction conditions. However, in actuality, it becomes more difficult to detect a reproduction signal as the recording capacity increases (e.g., shorter mark length), with the result that it becomes that much more difficult for the PLL circuit to be converged in the locked state and thus maintain a stably-converged state. In view of this point, an advantage of including the PLL measurement section 60 becomes larger as the recording capacity set in the disc drive apparatus increases.

Furthermore, although the ITR-type PLL circuit 50 is illustrated as the PLL circuit as the measurement target in FIG. 1, a type of the PLL circuit as the measurement target is not particularly limited.

Further, FIGS. 1 to 5 have been described assuming that the PLL measurement section 60 is structured to output both the convergence judgment result (convergence flag fc(k)) and the convergence time cnv_time as the measurement result. However, basically, the PLL measurement section 60 only needs to be capable of outputting the convergence judgment result (convergence flag fc(k)).

Moreover, although two evaluation values of the phase error moving average Avr(k) and the phase error variance Var(k) have been used for obtaining the convergence judgment result (convergence flag fc(k)) as shown in FIG. 3, it is also possible for the convergence judgment result to be obtained based on a result of comparing only the phase error moving average Avr(k) with a threshold value.

In addition, as described above, as the basic structure, the PLL measurement section 60 of this embodiment can be structured as a singular PLL measurement apparatus. Such a singular PLL measurement apparatus can be used for grasping performance in designing and testing a PLL circuit, for example. Moreover, the PLL measurement apparatus can also be used for an inspection, adjustment, and the like in a production process.

Also in the case of structuring an apparatus including the PLL measurement section 60 of this embodiment, the apparatus is not limited to the disc drive apparatus shown in FIG. 6 as long as it includes a PLL circuit. For example, the apparatus may be a disc drive apparatus that supports a format other than the BD format. Moreover, the apparatus is also applicable to a reproduction apparatus that supports a recording medium other than an optical disc, a communication apparatus, and a reception apparatus for broadcasts and the like.

The PLL measurement section 60 can be constituted of hardware, for example, or can be realized by a program and instruction given to a DSP (Digital Signal Processor). Furthermore, such a program can be stored in a removable recording medium or a server on a network, for example.

The present application contains subject matter related to that disclosed in Japanese Priority Patent Application JP 2009-055990 filed in the Japan Patent Office on Mar. 10, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A measurement apparatus comprising:
a moving average calculation means for calculating a moving average by inputting a phase error between a phase of an input signal and a target phase, that is detected by a phase-locked loop circuit; and
a convergence judgment means for judging that the phase-locked loop circuit is not converged when an absolute value of the moving average is larger than or equal to a first threshold value and judging that the phase-locked loop circuit is converged when the absolute value of the moving average is smaller than the first threshold value.

2. The measurement apparatus according to claim 1 further comprising:

a phase error variance calculation means for calculating a phase error variance using the phase error and the moving average,
wherein the convergence judgment means judges that the phase-locked loop circuit is converged when the phase error variance is smaller than or equal to a second threshold value and the absolute value of the moving average is smaller than the first threshold value.

3. The measurement apparatus according to claim 1, wherein
the convergence judgment means sets, together with the first threshold value, a third threshold value having an absolute value larger than that of the first threshold value, and
the convergence judgment means compares the absolute value of the moving average and the third threshold value when judged that the phase-locked loop circuit is converged, and judges that the phase-locked loop circuit is not converged in a locked state when the absolute value of the moving average becomes larger than or equal to the third threshold value.

4. The measurement apparatus according to claim 1, wherein
the convergence judgment means judges, based at least in part on a result of the judgment that the phase-locked loop circuit is converged, a convergence time from a time the phase-locked loop circuit starts a pull-in operation to a time the phase-locked loop circuit is converged.

5. A reproduction apparatus comprising:
a read-out means for reading out a signal recorded onto an optical disc and outputting a reproduction baseband signal;
a phase-locked loop circuit to detect a phase error between a phase of the reproduction baseband signal and a target phase, and to control the phase of the reproduction baseband signal to be synchronized with the target phase based at least in part on the detected phase error;
a moving average calculation means for calculating a moving average by inputting the phase error between the phase of the reproduction baseband signal and the target phase, that is detected by the phase-locked loop circuit; and
a convergence judgment means for judging that the phase-locked loop circuit is not converged when an absolute value of the moving average is larger than or equal to a first threshold value and judging that the phase-locked loop circuit is converged when the absolute value of the moving average is smaller than the first threshold value.

6. The reproduction apparatus according to claim 5,
wherein the read-out means reads out, when $\alpha/\beta$, where $\alpha$ represents a shortest recording mark spatial frequency as a spatial frequency of a shortest recording mark and $\beta$ represents a diffraction barrier spatial frequency as a spatial frequency of a diffraction barrier of an optical system constituting the read-out means, at a time recoding is performed under a legitimate recording/reproduction condition corresponding to a format of the optical disc is set to $\gamma$, a signal recorded under an extended recording/reproduction condition satisfying $\alpha/\beta > \gamma$ different from the legitimate condition under the same extended recording/reproduction condition, and outputs the signal as the reproduction baseband signal.

7. A measurement method comprising the steps of:
calculating a moving average by inputting a phase error between a phase of an input signal and a target phase, that is detected by a phase-locked loop circuit; and judging that the phase-locked loop circuit is not converged when an absolute value of the moving average is larger than or equal to a first threshold value and judging that the phase-locked loop circuit is converged when the absolute value of the moving average is smaller than the first threshold value.

8. A measurement apparatus comprising:

a moving average calculation section to calculate a moving average by inputting a phase error between a phase of an input signal and a target phase, that is detected by a phase-locked loop circuit; and a convergence judgment section to judge that the phase-locked loop circuit is not converged when an absolute value of the moving average is larger or equal to than a first threshold value and judge that the phase-locked loop circuit is converged when the absolute value of the moving average is smaller than the first threshold value.

* * * * *